United States Patent
Saniter et al.

(10) Patent No.: US 8,525,543 B2
(45) Date of Patent: Sep. 3, 2013

(54) METHOD AND ELECTRIC CIRCUIT FOR TESTING A POWER PRODUCER OR A POWER CONSUMER THAT CAN BE CONNECTED TO AN ELECTRIC POWER GRID

(75) Inventors: Christoph Saniter, Berlin (DE); Joerg Janning, Berlin (DE)

(73) Assignee: Converteam GmbH, Berlin (DE)

( * ) Notice: Subject to any disclaimer, the term of this patent is extended or adjusted under 35 U.S.C. 154(b) by 374 days.

(21) Appl. No.: 12/662,425

(22) Filed: Apr. 16, 2010

(65) Prior Publication Data

US 2010/0308857 A1    Dec. 9, 2010

(30) Foreign Application Priority Data

Apr. 23, 2009  (DE) .......................... 10 2009 018 377

(51) Int. Cl.
*G01R 31/40*    (2006.01)

(52) U.S. Cl.
USPC .................................... 324/764.01

(58) Field of Classification Search
USPC ......... 324/764.01, 762.01–762.1; 363/39–41
See application file for complete search history.

(56) References Cited

U.S. PATENT DOCUMENTS

| | | | |
|---|---|---|---|
| 3,371,263 A * | 2/1968 | Ostreicher et al. | ............ 363/100 |
| 3,775,603 A | 11/1973 | Ainsworth | |
| 5,740,022 A * | 4/1998 | Abe | ................................. 363/39 |
| 6,900,972 B1 | 5/2005 | Chan et al. | |
| 7,254,045 B2 * | 8/2007 | Imamura | ....................... 363/21.1 |
| 2003/0227172 A1 | 12/2003 | Erdman et al. | |

FOREIGN PATENT DOCUMENTS

| | | |
|---|---|---|
| DE | 20 46 206 | 3/1971 |
| DE | 26 13 169 | 9/1977 |
| DE | 198 53 464 | 4/2000 |
| EP | 1 995 456 | 11/2008 |
| GB | 1 351 563 | 5/1974 |
| WO | WO 2008/125718 | 10/2008 |

OTHER PUBLICATIONS

German examination report dated Dec. 17, 2009 for corresponding applicaiton No. 10 2009 018 377.
Search Report for European Application No. 10003755.5 dated Feb. 25, 2013.
Florin Iov et al., "Grid Code Compliance of Grid-Side Converter in Wind Turbine Systems," Power Electronics Specialists Conference, 2006. 37th IEEE Jeju, Korea, Jun. 18-22, 2006, Piscataway, NJ, USA, IEEE, Jun. 18, 2006, Seiten 1-7, XP010945038.
Office Action for corresponding Chinese Application No. 201010166024.6 dated Feb. 5, 2013.

* cited by examiner

*Primary Examiner* — Tung X Nguyen
(74) *Attorney, Agent, or Firm* — Harness, Dickey & Pierce

(57) ABSTRACT

Described is an electric circuit which is intended, in particular, for the testing of a power producer in a wind power plant. The power producer is connected to a terminal point and is provided with a converter circuit which can be used to influence a voltage that is present at the terminal point. Also provided is a series connection configured with a choke coil and a first switch and connected to the terminal point. In at least one embodiment, a control and/or regulating system is provided for influencing, in a time-synchronized manner, on the one hand the converter circuit, such that the voltage at the terminal point transitions to a desired value and, on the other hand, the closing of the first switch.

20 Claims, 2 Drawing Sheets

METHOD AND ELECTRIC CIRCUIT FOR TESTING A POWER PRODUCER OR A POWER CONSUMER THAT CAN BE CONNECTED TO AN ELECTRIC POWER GRID

PRIORITY STATEMENT

The present application hereby claims priority under 35 U.S.C. §119 on German patent application number DE 10 2009 018 377.9 filed Apr. 23, 2009, the entire contents of which are hereby incorporated herein by reference.

FIELD

At least one embodiment of the invention generally relates to a method and/or an electric circuit for testing a power producer or a power consumer that can be connected to a power grid. The power producers or the power consumers can be generators, motors, fuel cells, solar converters, so-called power conditioning systems or other electrical components which can be connected to a power grid.

In particular, at least one embodiment of the invention relates to a method and an electric circuit for testing a generator of a wind power plant. It is understood that at least one embodiment of the invention can also be used for a hydropower plant or a gas-heating power plant or the like.

BACKGROUND

For generating power, wind power plants are known for which a generator is driven with the aid of a wind mill that is subjected to the wind. The generated electrical power is then fed into a power grid.

The operators of power grids have specified conditions which must be met by a wind power plant before it can be connected to a power grid. A so-called fault-ride-through condition requires that the wind power plant can continue to feed electrical power into the power grid, even in the event of a short circuit of the power grid. In that case, the voltage drops at the connection point for the wind power plant to a partial voltage or even to zero.

Known is the separate testing, meaning independent of the wind power plant, of electrical components which are used for producing electric power, in particular the generator and, if applicable, the associated converters with the aid of electric simulation circuits. A wind simulation, for example, can be realized with the aid of an electric motor that simulates a desired wind which then acts upon the generator. A grid simulation can furthermore exist which simulates a power grid into which the generator feeds the produced electric power. This grid simulation is connected electrically to the generator or the associated converters. The grid simulation can be influenced in such a way that a desired voltage course for the power grid with adjustable frequency is generated which is then preset in the generator.

The known methods and electrical circuits can simulate a voltage drop toward zero, meaning a short circuit of the power grid. However, the voltage drop can occur only at fixedly predetermined steps and with a fixed frequency.

SUMMARY

In at least one embodiment of the present invention, a method and/or an electric circuit is provided which allows adjusting optional voltage courses at optional frequencies.

In at least one embodiment of the invention, the power producer or the power consumer is connected to a terminal point. Also provided is a converter circuit for influencing a voltage that is present at the terminal point. A series connection is configured with a choke coil and a first switch and is connected to the terminal point. In a time-coordinated manner, the converter circuit is influenced on the one hand in such a way that the voltage at the terminal point changes to a desired value while, on the other hand, the first circuit is closed.

The drop or short circuit in the simulated power grid is thus created through an interaction of two measures, namely the reduction in the aforementioned voltage with the aid of the converter circuit, as well as the closing of the first switch. These steps have the advantage that a simulated drop or short circuit can be achieved easily, without substantial additional expenditure. In view of the converter circuit, it is sufficient to have a lower overload capacity than is required according to the prior art since the current flow is lower in the case where the first switch is not closed. The testing of the power producer or the power consumer can thus be simplified considerably and can also be improved.

According to one embodiment of the invention, a parallel circuit is provided which is configured with a choke coil and a second switch and is connected between the converter circuit and the terminal point. The second switch is opened coordinated in time with the converter circuit and the first switch. With the aid of the additional choke coil, it is possible to influence the transition to the desired value of the voltage that is present at the terminal point. In particular, it is possible to change the so-called "hardness" of the simulated power grid.

In the same way, at least one embodiment of the invention provides for the first switch to be opened and thus stop the simulated drop or short circuit of the power grid. The resulting voltage change can again be influenced with the aid of the converter circuit.

According to one modification of at least one embodiment of the invention, the switch (switches) is (are) embodied as electronic semiconductor component (components), for example in the form of a thyristor with or without associated quenching circuit or a GTO thyristor (GTO=gate turnoff) or an IGBT (IGBT=insulated gate bipolar transistor) that can be switched off. These embodiments have the advantage that the moment of actuating the switch (switches) can be controlled particularly easily and precisely. The use of thyristors without quenching circuit, in particular, can be advantageous since these thyristors simulate relatively realistically the behavior of a medium voltage switch.

According to a different modification of at least one embodiment of the invention, the inductance (inductances) of the choke coil (coils) can be adjusted, thus making it possible to achieve identical voltage drops with different frequencies of the simulated power grid.

BRIEF DESCRIPTION OF THE DRAWINGS

Additional features, options for use and advantages of the invention can be deduced from the following description of example embodiments of the invention, which are shown in the Figures of the drawing. All described or shown features by themselves or in any combination thereof form the subject matter of the invention, independent of how they are combined in the patent claims or the references back, as well as independent of their formulation and/or representation in the specification and/or the drawing.

DETAILED DESCRIPTION OF THE EXAMPLE EMBODIMENTS

Figure 1:
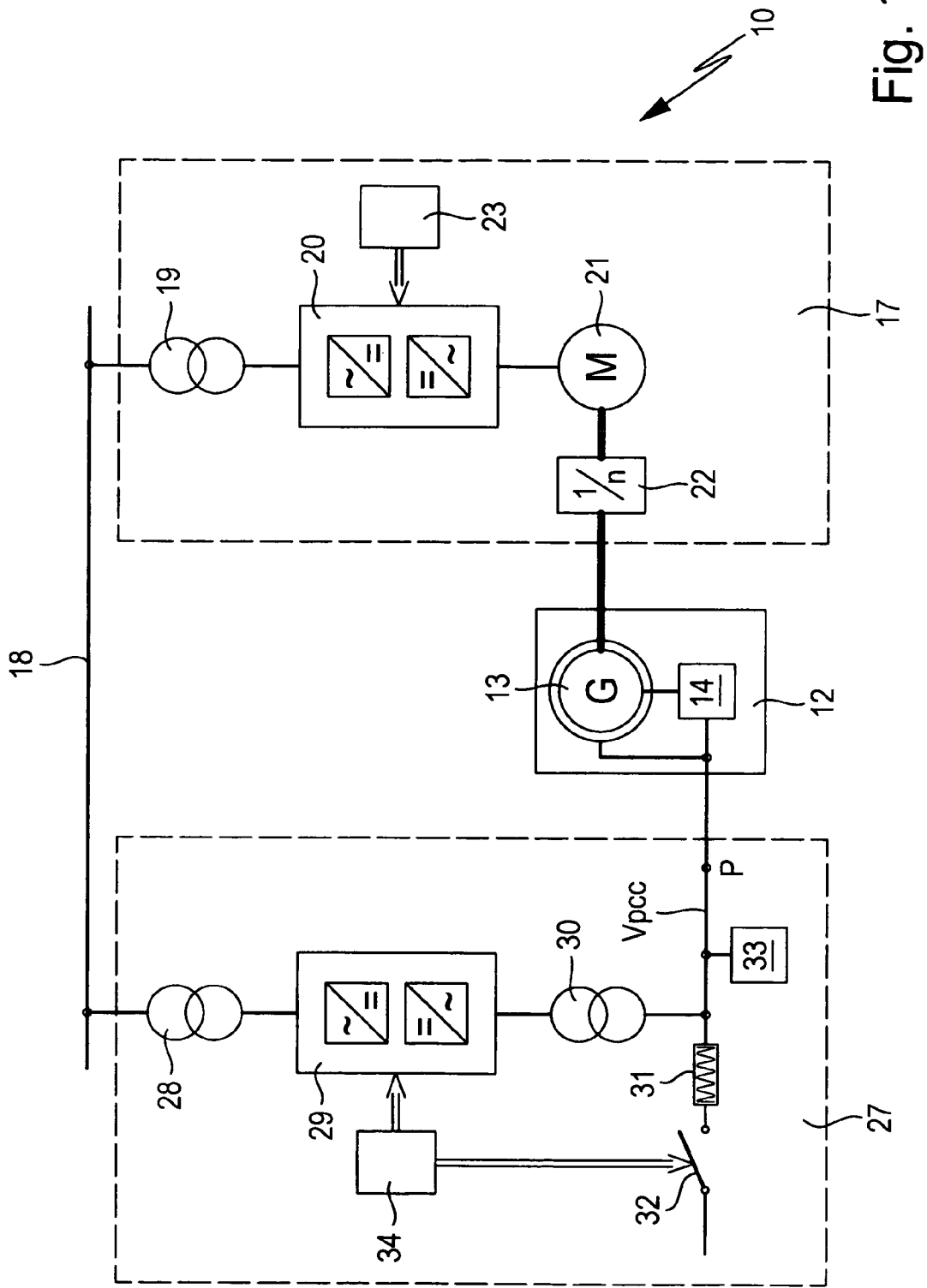
FIG. 1 shows a schematic wiring diagram of a first example embodiment of an electric circuit according to the invention for testing a generator, in particular a generator for a wind power plant.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially, relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Shown in FIG. 1 is an electric circuit 10 which is used in the example embodiment in connection with a wind power plant. It is understood that the circuit 10 can also be used for a hydropower plant or a gas-heating power plant or the like. The circuit 10 for the example embodiment is furthermore intended for testing a generator. It is understood that other power producers or power consumers can also be tested with the circuit 10. For example, it is possible to test an electric motor or a fuel cell or a solar inverter or a so-called power conditioning system or the like.

The circuit 10 in FIG. 1 is essentially shown only as a single-phase circuit for the purpose of simplification. It is understood that the circuit 10 can also be embodied as two-phase and multi-phase circuit.

The circuit 10 has a generator circuit 12 which is to be tested. The generator circuit 12 represents those components of the wind power plant which function to produce electric power. For the present example embodiment, the generator circuit 12 can be configured with a dual-fed asynchronous generator 13 with associated converters 14. The rotor of the asynchronous generator 13 is connected via the converters to a terminal point of the generator circuit 12, and the stator of the asynchronous generator 13 is connected directly to this terminal point. It is understood that other types of generators can also be used, for example synchronous generators and/or that no converters may be provided.

The circuit 10 is provided with a wind simulation 17 which, for the present example embodiment, is supposed to simulate the wind driving the asynchronous generator 13. The wind simulation 17 is configured with a transformer 19 that is connected to a power grid 18, a converter circuit 20 and an electric motor 21. The drive shaft of the electric motor is connected, via an intermediate gear 22 if applicable, fixedly to the drive shaft of the generator 13, so as to rotate along.

With the aid of a control and/or regulating system 23, the converter circuit 20 can be influenced over time in such a way that the resulting speed curve for the electric motor 21 corresponds to a desired wind for driving the asynchronous generator 13.

The electric circuit 10 does not need to be located directly adjacent to the wind power plant, but can be installed independent of the wind power plant, for example in a test hangar. It is understood, however, that the circuit 10 can also be positioned directly adjacent to the wind power plant. In the case where the generator circuit 12 is installed as part of the wind power plant, the asynchronous generator 13 in particular is connected to the wind wheel of the wind power plant so as to rotate along. The wind simulation 17 can thus be omitted without replacement.

The electric circuit 10 is provided with a net simulation 27 for simulating the voltage course over time of a simulated power grid. The generator circuit 12 feeds electric power into this simulated power grid. The net simulation 27 is configured with a transformer 28 that is connected to the power grid 18, a converter circuit 29 and a different transformer 30 that may additionally be provided. The converter circuit 29 is connected via the additional transformer 30 to the generator circuit 12, meaning for the present example embodiment to the previously mentioned terminal point of the generator circuit 12. Starting with this terminal point of the generator circuit 12, a different terminal point P exists along the connection to the transformer 30, wherein a voltage Vpcc is present at this terminal point (pcc=point of common coupling).

Alternatively, it is possible to have a joint direct-voltage bar between the two converter circuits 20, 29 for the wind simulation 17 and the grid simulation 27. In that case, only a single grid-side converter and only a single transformer are required in the direction toward the power grid 18.

A choke coil 31 and a first switch 32 are connected in series to the terminal point P. The sequence in which the components are connected is not important in this case, so that the switch 32 can also be connected to the terminal point P. This series connection can be connected to a neutral point for several phases. It is also possible that the series connection forms a component of a delta connection for several phases. If applicable, the series connection can furthermore be connected to ground.

A filter circuit 33 is furthermore also connected to the terminal point P.

The inductance of the choke coil 31 can be changed, for example by manually adjusting the number of windings of the choke coil 31 with the aid of mechanical devices. By making corresponding adjustments to the choke coil 31, it is possible to generate essentially identical courses for the simulated power grid, that is to say independent of the frequency of the simulated power grid.

The first switch 32 is embodied as electronic semiconductor component. For example, the switch 32 can be a thyristor with or without associated quenching circuit or a GTO thyristor (GTO=gate turnoff) or an IGBT (IGBT—insulated gate bipolar transistor) that can be turned off or a similar component, wherein these components can preferably be configured as modules and can thus already comprise freewheeling diodes and the like.

The filter circuit 33 can be a known electric circuit which is used for smoothing the voltage Vpcc.

With the aid of a control and/or regulating system 34, the converter circuit 29 can be influenced over time in such a way that the resulting course over time of the voltage Vpcc corresponds to a desired voltage course of a power grid. The specified voltage courses in this case can be adjusted to be symmetrical or asymmetrical. However, different frequencies of the simulated power grid can also be adjusted freely with the aid of the converter circuit 29, in particular for 50 hertz and 60 hertz.

The control and/or regulating system 34 is furthermore provided for moving the switch 32 from a closed to an opened state and vice versa. In the following, we proceed on the assumption that the switch 32 is in the opened state and that the choke coil 31 is therefore not activated.

On the whole, a generator circuit 12 to be tested can be subjected with the aid of the wind simulation 17 to a desired wind and, with the aid of the grid simulation 27, to a specified voltage course of the supplied power grid. The electric circuit 10 is therefore among other things suitable for testing the behavior of the generator circuit 12 during a single-phase or a multi-phase drop to a desired specified voltage or even to zero in the supplied power grid and can thus be tested for a single-phase or multiphase short circuit.

In order to simulate a drop or short circuit in the supplied power grid, the grid simulation 27 realizes two measures in a timely synchronized manner. On the one hand, the converter circuit 29 is influenced such that the voltage Vpcc changes as quickly as possible to the desired specified voltage or to zero. On the other hand, the first switch 32 is switched to the closed state, so that the voltage Vpcc is present over the choke coil 31. These two measures do not have to be carried out simultaneously, but occur during a time period that mostly coincides. The sequence of the two aforementioned measures is not critical in this case. Essential is the timely coordination of the two measures relative to each other, such that the transition to the desired drop or short circuit of the simulated power grid that is fed by the generator circuit 12 follows the desired course.

For example, the two measures are synchronized in such a way that the voltage Vpcc is first reduced with the aid of the converter circuit 29 and is then determined by the voltage drop over the choke coil 31, caused by the closing of the circuit 32.

As a result of these measures—as mentioned before—a drop to the desired specified voltage or a short circuit can be simulated in the power grid which is supplied with power by the generator circuit 12. It can thus be tested how the generator circuit 12 will behave in such a case. In particular, it can be tested whether the generator circuit 12 meets the so-called fault-ride through conditions.

Such fault-ride-through conditions are specified by the operators of power grids. These conditions stipulate, for example, that a wind power plant connected to a power grid should be able to continue to feed active power and reactive power into the power grid, even in the case of a grid short circuit.

To stop the stimulated drop or short circuit in the power grid, the grid simulation 27 reverses the two previously explained measures. Here again, the sequence of the measures or whether these measures occur simultaneously is not critical, only that they are coordinated in time. For example, the first switch 32 is first moved to its opened state and the converter circuit 29 is then influenced in such a way that the voltage Vpcc again rises to a desired value.

Figure 2:
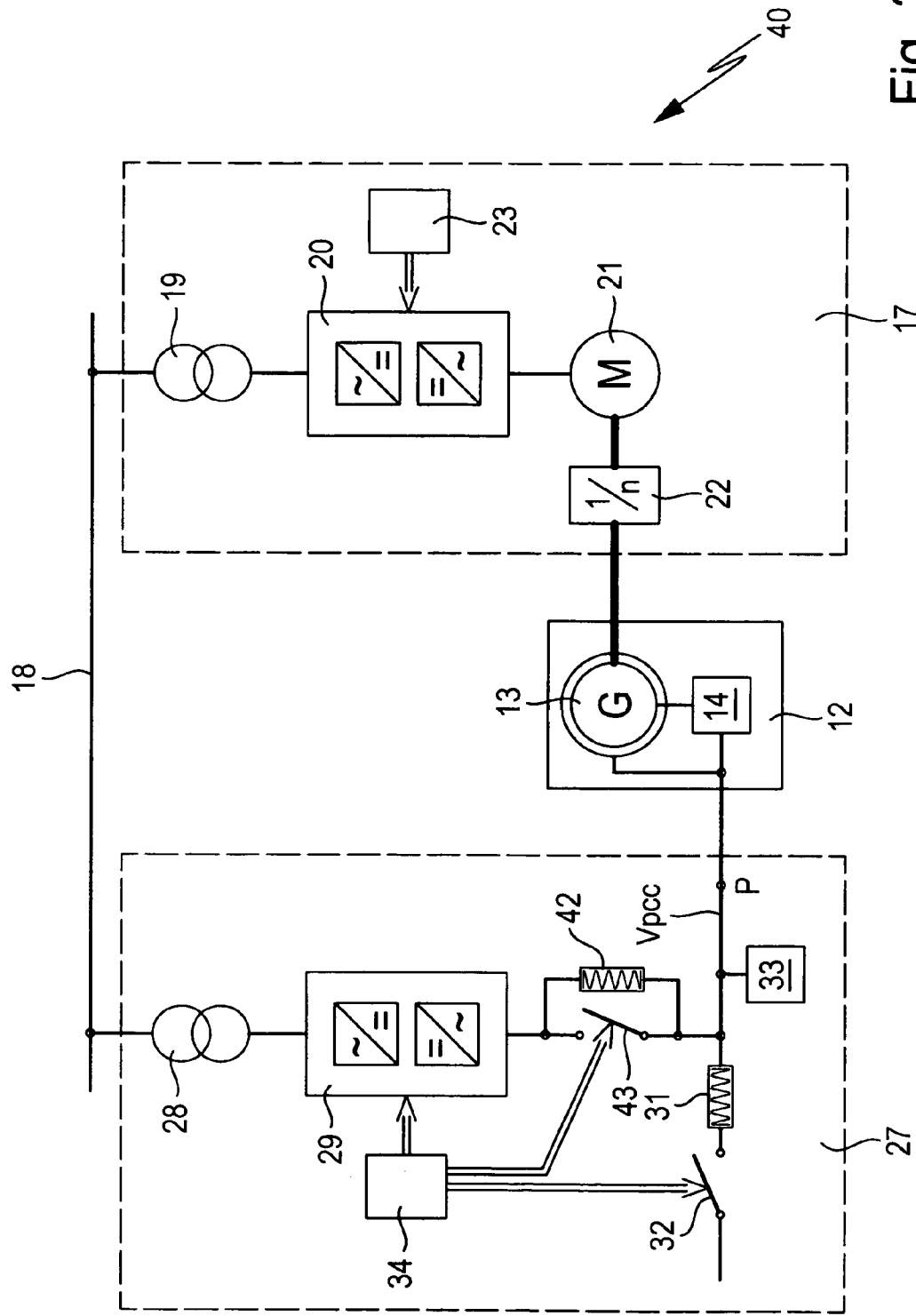
FIG. 2 shows a schematic wiring diagram of a second example embodiment of a corresponding electric circuit.

FIG. 2 shows an electric circuit 40 that is an improved version of the circuit 10 shown in FIG. 1. In the modified version of the circuit 10 in FIG. 1, the circuit 40 in FIG. 2 is provided with a parallel circuit comprising a choke coil 42 and a second switch 43. In contrast to the circuit 10 in FIG. 1, the circuit 40 in FIG. 2 has no additional transformer 30. However, it is pointed out expressly that this additional transformer 30 can be provided for the circuit 40 in FIG. 2.

The parallel circuit is connected between the converter circuit 29 and the terminal point P. If an additional transformer 30 exists, the parallel circuit is connected between this additional transformer 30 and the terminal point P.

With regard to the components of the circuit 40 that coincide with those in the circuit 10, we refer to the above explanations for FIG. 1. In the following, we explain in further detail only those components and functions of the circuit 40 in FIG. 2 which differ from those of the circuit 10 in FIG. 1.

The inductance of the choke coil 42 can be changed, for example by manually adjusting the number of windings of the choke coil 42 with the aid of mechanical devices.

The second switch 43 is embodied as electronic power semiconductor component. The switch 43, for example, can be a thyristor with an associated quenching circuit or a GTO thyristor (GTO=gate turnoff) or an IGBT (IGBT=insulated gate bipolar transistor) that can be switched off, or a similar component. These components can preferably be configured as modules and thus can already contain freewheeling diodes and the like.

The control and/or regulating system 34 is furthermore provided for switching the second switch 43 from a closed to an opened state and vice versa. In the following, we proceed on the assumption that the switch 32 is in the opened state and the switch 43 is in its closed state. As a result, both choke coils 31, 42 are not activated.

To simulate a drop or short circuit of a power grid, the wind simulation 27 realizes three measures which are coordinated in time. On the one hand, the second switch 43 is opened and, on the other hand, the converter circuit 29 is influenced in such a way that the voltage Vpcc transitions as quickly as possible to the desired, specified voltage or to zero. The first switch 32 is furthermore switched in the closed state so that the voltage Vpcc drops over the choke coil 31. These three measures need not be realized simultaneously, but are run in a time period which for the most part coincides. The sequence of the aforementioned measures in this case is not critical. Essential is the coordination in time of the three measures, such that the transition to the desired drop or short circuit in the simulated power grid, supplied by the generator circuit 12, follows the desired course. For example, the three measures are synchronized relative to each other in such a way that the second switch 43 is opened first, allowing the voltage Vpcc to be reduced via the converter circuit 29 and that finally, this voltage Vpcc over the choke coil 31 is allowed to drop as a result of closing the first switch 32. At the very least, these three measures are coordinated in time in such a way that the closing of the switch 43 occurs during a time period before a drop or short circuit of the voltage Vpcc is simulated.

As a result of these measures it is possible—as mentioned—to simulate a drop or a short circuit in the power grid supplied with electric power by the generator circuit 12, thus making it possible to test how the generator circuit 12 behaves in those instances. In particular, it is possible to test whether the generator circuit 12 meets the previously mentioned fault-ride-through conditions.

In order to stop the simulated drop or short circuit in the power grid, the three previously explained measures are reversed again by the grid simulation 27. Here too, it is not critical whether these measures are taken simultaneously or the sequence of these measures, but only their coordination in time. For example, the first switch 32 is first moved to the opened state so that the converter circuit 29 can be influenced in such a way that the voltage Vpcc increases once more to the desired value. Finally, the second switch 43 is closed again.

The patent claims filed with the application are formulation proposals without prejudice for obtaining more extensive patent protection. The applicant reserves the right to claim even further, combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combineable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, computer readable medium and computer program product. For example, of the aforementioned methods may be embodied in the form of a system or device, including, but not limited to, any of the structure for performing the methodology illustrated in the drawings.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for testing a power producer or a power consumer that is connectable to a power grid, the power producer or the power consumer being connectable to a terminal point, a converter circuit being connectable to the terminal point, the converter circuit configured to be influenced over time in such a way that a resulting course over time of a voltage at the terminal point corresponds to a desired voltage course, a choke coil and a first switch connected in a series connection and connectable to the terminal point, the method comprising:

influencing the converter circuit over time using at least one of a control and regulating system; and testing the power producer or the power consumer by coordinating in time, the influencing of the converter circuit such that a voltage at the terminal point transitions to a desired value, and closing of the first switch.

2. The method according to claim 1, wherein a parallel circuit is provided, configured with a second choke coil and a second switch, connected between the converter circuit and the terminal point, the method further comprising:
coordinating in time, an opening of the second switch with the converter circuit and the closing of the first switch.

3. The method according to claim 2, wherein the second switch is opened first and the converter circuit is then influenced in such a way that the voltage transitions to the desired value and the first switch is subsequently closed.

4. A method for testing a power producer or a power consumer that is connectable to an electric power grid, the power producer or the power consumer being connectable to a terminal point and a converter circuit being connectable to the terminal point, the converter circuit configured to be influenced over time in such a way that a resulting course over time of a voltage at the terminal point corresponds to a desired voltage course, a choke coil and a first switch connected in a series connection and connectable to the terminal point, the method comprising:
influencing the converter circuit over time, using at least one of a control and regulating system; and
testing the power producer or the power consumer by coordinating in time, the influencing of the converter circuit in such a way that a voltage at the terminal point transitions to a desired value, and opening of the first switch.

5. The method according to claim 4, wherein a parallel circuit is provided, configured with a choke coil and a second switch, connected between the converter circuit and the terminal point, the method further comprising:
closing the second switch, coordinated in time with the converter circuit and the opening of the first circuit.

6. An electric circuit for testing a power producer or a power consumer that is connectable to an electric power grid, the power producer or the power consumer being connectable to a terminal point, the electric circuit comprising:
a converter circuit connectable to the terminal point, the converter circuit configured to be influenced over time in such a way that a resulting course over time of a voltage at the terminal point corresponds to a desired voltage course;
a choke coil and a first switch connected in a series connection and connectable to the terminal point; and
at least one of a control and regulating system configured to influence the converter circuit over time and switch the first switch to test the power producer or the power consumer by coordinating in time the converter circuit being influenced such that a voltage at the terminal point transitions to a desired value and the first switch is closed.

7. The electric circuit according to claim 6, further comprising:
a parallel circuit configured with a choke coil and a second switch, connected between the converter circuit and the terminal point, wherein
the second switch is opened by the at least one of control and regulating system so as to be synchronized in time with the converter circuit and the closing of the switch.

8. The switch according to claim 6, wherein the first switch is embodied as an electronic semiconductor component.

9. The switch according to claim 8, wherein the first switch is embodied as an electronic semiconductor component, taking the form of a thyristor with or without an associated quenching circuit or a gate turnoff (GTO) thyristor or an insulated gate bipolar transistor (IGBT) that can be turned off.

10. The circuit according to claim 6, wherein an inductance of the choke coil is adjustable.

11. The circuit according to claim 6, wherein a filter circuit is provided which is connectable to the terminal point.

12. The circuit according to claim 6, wherein an asynchronous generator or a synchronous generator is provided, if applicable with the associated converters.

13. The circuit according to claim 6, wherein the power producer is intended for use in a wind power plant.

14. The circuit according to claim 13, wherein a wind simulation exists which is provided with electric motor that is connectable to the power producer, so as to rotate along.

15. The circuit according to claim 14, wherein the power producer has not yet been installed in the wind power plant.

16. An electric circuit for testing a power producer or a power consumer that is connectable to an electric power grid, the power producer or the power consumer being connectable to a terminal point, the electric circuit comprising:
a converter circuit connectable to the terminal point, the converter circuit configured to be influenced over time in such a way that a resulting course over time of a voltage at the terminal point corresponds to a desired voltage course;
a choke coil and a first switch connected in a series connection and connected to the terminal point; and
at least one of a control and regulating system configured to influence the converter circuit over time and switch the first switch to test the power producer or the power consumer by coordinating in time the converter circuit being influenced such that a voltage at the terminal point transitions to a desired value and the first switch is opened.

17. The electric circuit according to claim 16, wherein further comprising:
a parallel circuit configured with a choke coil and a second switch, connected between the converter circuit and the terminal point, wherein
the second switch is opened by the at least one of control and regulating system so as to be synchronized in time with the converter circuit and the opening of the switch.

18. The switch according to claim 16, wherein the first switch is embodied as an electronic semiconductor component.

19. The circuit according to claim 16, wherein an inductance of the choke coil is adjustable.

20. The circuit according to claim 16, wherein the power producer is intended for use in a wind power plant.

* * * * *